United States Patent
Gallagher et al.

(10) Patent No.: US 6,943,831 B2
(45) Date of Patent: Sep. 13, 2005

(54) METHOD AND APPARATUS TO EXTEND THE EFFECTIVE DYNAMIC RANGE OF AN IMAGE SENSING DEVICE AND USE RESIDUAL IMAGES

(75) Inventors: Andrew C. Gallagher, Brockport, NY (US); Kevin E. Spaulding, Spencerport, NY (US)

(73) Assignee: Eastman Kodak Company, Rochester, NY (US)

( * ) Notice: Subject to any disclaimer, the term of this patent is extended or adjusted under 35 U.S.C. 154(b) by 800 days.

(21) Appl. No.: 09/768,695

(22) Filed: Jan. 24, 2001

(65) Prior Publication Data

US 2002/0130957 A1 Sep. 19, 2002

(51) Int. Cl.[7] .......................... H04N 5/228; H04N 3/14; H04N 5/335; H04N 5/235
(52) U.S. Cl. .................... 348/222.1; 348/294; 348/340; 348/362
(58) Field of Search .......................... 348/222.1, 229.1, 348/241, 243, 231.99, 394, 302, 308, 311, 335, 340, 273, 274, 375, 294, 275, 362, 367, 364; 358/518, 443; 382/167; 257/294, 98, 432, 435, 440

(56) References Cited

U.S. PATENT DOCUMENTS

| | | | |
|---|---|---|---|
| 3,971,065 A | 7/1976 | Bayer | |
| 4,667,092 A | 5/1987 | Ishihara | |
| 5,012,333 A | 4/1991 | Lee et al. | |
| 5,652,621 A | 7/1997 | Adams, Jr. et al. | |
| 6,040,858 A | 3/2000 | Ikeda | |
| 6,115,065 A | * 9/2000 | Yadid-Pecht et al. | ....... 348/308 |
| 6,249,898 B1 | * 6/2001 | Koh et al. | ..................... 716/4 |
| 6,275,253 B1 | * 8/2001 | Melen | ......................... 348/43 |
| 6,495,813 B1 | * 12/2002 | Fan et al. | ................ 250/208.1 |
| 6,593,970 B1 | * 7/2003 | Serizawa et al. | ........... 348/362 |
| 6,627,305 B1 | * 9/2003 | Deane et al. | ............ 428/304.4 |
| 6,661,451 B1 | * 12/2003 | Kijima et al. | ............ 348/220.1 |
| 6,697,114 B1 | * 2/2004 | Merrill | ...................... 348/308 |

FOREIGN PATENT DOCUMENTS

| | | | | |
|---|---|---|---|---|
| JP | 63147365 A | * 6/1988 | ........... H01L/27/14 |
| JP | 11150254 A | * 6/1999 | ........... H01L/27/14 |

* cited by examiner

Primary Examiner—Tuan Ho
Assistant Examiner—Justin Misleh
(74) Attorney, Agent, or Firm—Thomas H. Close

(57) ABSTRACT

An image capture system includes a sparsely sampled extended dynamic range image sensing device having fast photosites interspersed with slow photosites for producing a sparsely sampled high resolution digital image having fast pixel values produced by the fast photosites and slow pixel values produced by the slow photosites. A processor employs the slow pixel values to expand the dynamic range of the fast pixel values in the sparsely sample high resolution digital image to form a full resolution digital image having an extended dynamic range. A color encoder reduces the dynamic range of the full resolution digital image to fit within the dynamic range of a storage color space having a dynamic range less than that of the full resolution digital image to form a limited dynamic range digital image represented in the storage color space.

17 Claims, 10 Drawing Sheets

METHOD AND APPARATUS TO EXTEND THE EFFECTIVE DYNAMIC RANGE OF AN IMAGE SENSING DEVICE AND USE RESIDUAL IMAGES

FIELD OF THE INVENTION

The invention relates generally to the field of image capture, and more specifically to a method of preserving information resulting from capturing information with an extended dynamic range image sensing device.

BACKGROUND OF THE INVENTION

Image sensing devices, such as a charge-coupled device (CCD), are commonly found in such products as digital cameras, scanners, and video cameras. These image sensing devices have a very limited dynamic range when compared to traditional negative film products. A typical image sensing device has a dynamic range of about 5 stops. This means that the exposure for a typical scene must be determined with a fair amount of accuracy in order to avoid clipping the signal. In addition, oftentimes the scene has a very wide dynamic range as a result of multiple illuminants (e.g. front-lit and back-lit portions of a scene). In the case of a wide dynamic range scene, choosing an appropriate exposure for the subject often necessitates clipping data in another part of the image. Thus, the inferior dynamic range of an image sensing device relative to silver halide media results in lower image quality for images obtained by an image sensing device.

An increase in the dynamic range of an image sensing device would allow images from digital cameras to be rebalanced to achieve a more pleasing rendition of the image. Also, increasing the dynamic range of an image sensing device would allow for more pleasing contrast improvements to the image, such as is described by Lee et al. in commonly assigned U.S. Pat. No. 5,012,333 issued Apr. 30, 1991.

U.S. Pat. No. 6,040,858 issued Mar. 21, 2000 to Ikeda provides a complete description of the problem of the limited dynamic range of image sensing devices. In addition, Ikeda describes methods of extending the dynamic range of an image sensing device by utilizing multiple image signals, each with different responses to exposure. These multiple signals are combined by using thresholds which determine which signal is of higher quality at each position in the image signal to form an image signal having extended dynamic range. Ikeda improves upon these methods by describing a method by which these thresholds are determined for each color.

In addition to the dynamic range limitations associated with common image sensing devices, another problem is that color encodings associated with most common digital image storage formats also have a limited dynamic range. Typically, users of digital imaging devices, such as digital cameras, are accustomed to receiving digital images that are stored in a color encoding that will produce a pleasing image when displayed directly on a typical CRT monitor. This arrangement is convenient for many typical work-flows, and is desirable in many cases to maximize compatibility and interoperability. CRT monitors have a substantially limited color gamut relative to the color gamut of many common image sensing devices. (The color gamut of an imaging device refers to the range of colors and luminance values that can be produced by the device. The dynamic range is one aspect of color gamut relating to the range of luminance values that can be produced by the device.) The process of converting the color values captured by an image sensing device to those appropriate for display on a particular output device is often referred to as "rendering." The rendering process will typically result in a significant loss of image data corresponding to areas of the scene having colors outside the color gamut of the rendered space. Thus, even if an image sensing device with an extended dynamic range were available, the extra dynamic range may not be enjoyed, appreciated, or even noticed by the user if the image must be stored in a limited color gamut storage space before the extended color gamut image data can be used to form an improved image.

Thus, there exists a need to improve upon the method of the prior art in order to improve the dynamic range of an image sensing device and to allow the additional dynamic range of the device to be stored in a form useful to consumers. Specifically, there exists a need to produce an extended dynamic range image signal with a single image sensing device and a single image signal, and to represent that image signal in a standard form compatible with common image work-flows.

SUMMARY OF THE INVENTION

The present invention is directed to overcoming one or more of the problems set forth above. Briefly summarized, according to one aspect of the present invention, an image capture system for generating and storing an extended dynamic range digital image, includes a sparsely sampled extended dynamic range image sensing device having fast photosites with a predetermined response to light exposure interspersed with slow photosites with a slower response to the same light exposure for producing a sparsely sampled high resolution digital image having fast pixel values produced by the fast photosites and slow pixel values produced by the slow photosites; a digital image processor that employs the slow pixel values to expand the dynamic range of the fast pixel values in the sparsely sampled high resolution digital image to form a full resolution digital image having an extended dynamic range; a color encoder for reducing the dynamic range of the full resolution digital image to fit within the dynamic range of a storage color space having a dynamic range less than the dynamic range of the full resolution digital image to form a limited dynamic range digital image represented in the storage color space and for producing a residual image representing a difference between the full resolution digital image and the limited dynamic range digital image that can be used with the limited dynamic range digital image to reconstruct the full resolution digital image; and a digital image store for storing the limited dynamic range digital image in association with the residual image.

From another aspect, the invention includes an image sensor for generating an image signal useful in an extended dynamic range system, wherein the image sensor includes an array of photosites divided into fast photosites and slow photosites and a structural element overlying the photosites and providing the fast photosites with a predetermined standard response to a light exposure and the slow photosites with a slower response to the same light exposure. This structural element may take the form of: a) an array of lenslets overlying the photosites, wherein the lenslets overlying the fast photosites are structured to be more efficient in focusing light than the lenslets overlying the slow photosites; b) a mask with apertures overlying the photosites, wherein the apertures overlying the fast photosites are larger than the apertures overlying the slow photosites; or c) a neutral density filter overlying the photosites, wherein the portion of the neutral density filter overlying the fast photosites is more transparent than the portion of the neutral density filter overlying the slow photosites.

In the present invention, selected photosites of the image capture device are designed to have slow response to exposure. These slow photosites generally have a slower response to exposure than do the non-selected, or fast, photosites. The advantage of the invention is that the image signal from such a image capture device is processed to take advantage of the dynamic ranges of all photosites. Thus, an image signal having increased dynamic range is produced by interpolating the values of neighboring photosites for those photosites that are saturated or at a noise level.

Another feature of the present invention involves storing the extended dynamic range digital image in a storage color space having a limited dynamic range by adjusting the extended dynamic range digital image to fit within the limited dynamic range of the storage color space to form a limited dynamic range digital image; representing the limited dynamic range digital image in the storage color space; determining a residual image representing a difference between the extended dynamic range digital image and the limited dynamic range digital image; and associating the residual image with the limited dynamic range digital image in the storage color space such that the associated residual image and the limited dynamic range digital image in the storage color space are adapted to be used to form a reconstructed extended dynamic range digital image.

DETAILED DESCRIPTION OF THE INVENTION

A digital image is comprised of one or more digital image channels. Each digital image channel is comprised of a two-dimensional array of pixels. Each pixel value relates to the amount of light received by an imaging capture device corresponding to the geometrical domain of the pixel. For color imaging applications a digital image will typically consist of red, green, and blue digital image channels. Other configurations are also practiced, e.g. cyan, magenta, and yellow digital image channels. For monochrome applications, the digital image consists of one digital image channel. Motion imaging applications can be thought of as a time sequence of digital images. Those skilled in the art will recognize that the present invention can be applied to, but is not limited to, a digital image for any of the above mentioned applications.

Although the present invention describes a digital image channel as a two dimensional array of pixel values arranged by rows and columns, those skilled in the art will recognize that the present invention can be applied to mosaic (non rectilinear) arrays with equal effect. Those skilled in the art will also recognize that although the present invention describes replacing an original pixel value with processed pixel values, it is also contemplated to form a new digital image with the processed pixel values and retain the original pixel values.

Imaging devices employing electronic sensing devices are well known, therefore the present description will be directed in particular to elements forming part of, or cooperating more directly with, apparatus in accordance with the present invention. Elements not specifically shown or described herein may be selected from those known in the art. Note that as used herein, the term image is a two dimensional array of values. An image may be a two dimensional subset of another image. The present invention is preferably implemented using a programmed digital computer. The computer can be a general purpose computer, such as a personal computer, or a special purpose computer designed for image processing. It is within the ordinary skill of the programming art to produce a computer program for practicing the present invention based on the following disclosure.

Figure 1:
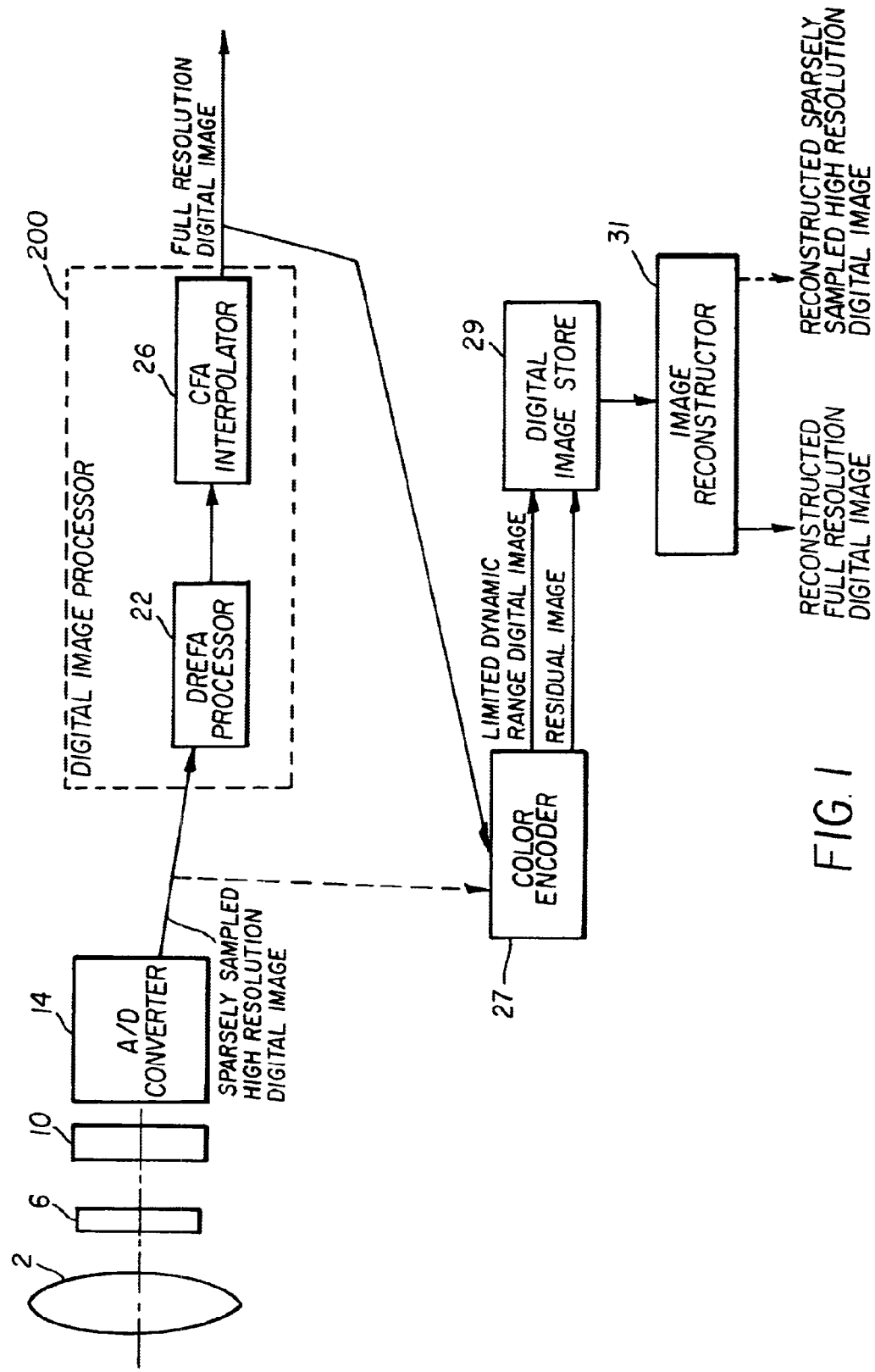
FIG. 1 is a block diagram of an image capture system for generating and storing an extended dynamic range digital image according to the invention.

The essential elements employed in the practice of the present invention are shown as a functional block diagram in FIG. 1. Light from an object or scene is incident upon a lens 2, forming a photographic image on an extended dynamic range image sensing device 10 such as a charged-coupled device (CCD) with a color filter array (CFA) having fast and slow photosites as described below. Note that other devices, such as CMOS devices, may be used as the image sensing device 10. The image sensing device 10 is a sparsely sampled, extended dynamic range image sensing device as will be described in further detail below. An optical low pass filter 6 placed between the lens 2 and the image sensing device 10, performs a slight blurring of the imaged light in order to reduce the occurrence of aliasing. An A/D converter 14 receives the voltage signal corresponding to the imaged light from the image sensing device 10 and produces an image signal corresponding to the voltage signal. As will be described in detail hereinbelow, the design of the image sensing device 10 is such that the image signal output from the A/D converter 14 is a sparsely sampled high resolution digital image. The digital image processor 200 receives the sparsely sampled high resolution digital image from the A/D converter 14, modifies the image signal and produces a full resolution digital image. As noted above, the digital image processor 200 can be a programmed personal computer, or a special purpose image processor. Alternatively, the present invention can be practiced in a film or reflection scanner or other device that produces an extended dynamic range digital image. A color encoder 27 receives as an input either the full resolution digital image or the sparsely sampled digital image and produces as an output a residual image and a limited dynamic range digital image, both of which are input to a digital image store 29 in order to be stored in such a manner that the residual image and the limited dynamic range digital image are associated with one another, for example a digital file. Finally, an image reconstructor 31 receives the digital file and forms a reconstructed full resolution digital image or the sparsely sampled digital image. The operations of the color encoder 27 and the digital image store 29 are more fully explained hereinbelow with reference to FIGS. 8, 9, and 12. The operation of the image reconstructor 31 is more fully explained with reference to FIGS. 10, 11, and 13.

The A/D converter 14 shown in FIG. 1 converts the voltage signal produced by the image sensing device 10 into an image signal, i.e. a stream of digital pixel values corresponding to the voltage signal produced by the photosites of the image sensing device 10. More specifically, the A/D converter 14 converts the voltage signal, nearly linear with respect to the intensity of the incident light, from the image sensing device 10 to a discrete digital image signal, e.g. a 10 bit signal where the linear encoded values range from 0 to 1023. The A/D converter 14 may also perform processing to convert the linear code value domain image signal to a nonlinear code value domain image signal, such as an 8 bit logarithmic signal as is commonly performed in the art. For example, the following equation can be used to convert a 10 bit linear image signal $a(x,y)$, where $(x,y)$ specifies the row and column index of the signal location with reference to the image sensing device 10, into an 8 bit logarithmic image signal $b(x,y)$:

$$b(x, y) = \begin{cases} 0 & 0 \le a(x, y) \le 31 \\ 73.5975 \ln a(x, y) - 255 & 32 \le a(x, y) \le 1024 \end{cases} \quad (1)$$

Note that each stop of exposure (in the linear response region of the image sensing device) results in a doubling of the linear image signal $a(x,y)$ and results in an increase of the logarithmically encoded image signal $b(x,y)$ by 51. In this case, the value 51 represents the number of code values per stop (cvs) of exposure.

The digital image processor 200 shown in FIG. 1 is shown to contain two sub-components. The image signal is received by the dynamic range extending filter array (DREFA) processor 22. The DREFA processor 22 processes the sparsely sampled high resolution digital image output from the A/D converter 14 by expanding the dynamic range of the image and interpolating the sample values. The DREFA processor 22 then transmits the modified image signal to the CFA interpolator 26 where the color values are interpolated to provide a color value at each pixel. The output of the CFA interpolator 26 is a full resolution digital image.

The purpose of the CFA interpolator 26 is to generate a full description of the color for each pixel location of the sensed photographic image. In the preferred embodiment, the image sensing device 10 consists of an array of photosensitive elements called photosites. Each photosite is typically provided with either a red, green, or blue filter, as described by Bayer in commonly assigned U.S. Pat. No. 3,971,065 issued Jul. 20, 1976, which is incorporated herein by reference. The Bayer array is a color filter array in which green filters are located in a checkerboard pattern over the photosites with red and blue filters alternating line by line to fill the interstices of the checkerboard pattern; this produces twice as many green filter sites as either red or blue filter sites. Note that the method described herein may be easily extended to color filter arrays with different arrangements of the primaries, a different number of primaries, or a different set of primaries. Thus, in the preferred embodiment, each photosite is sensitive to either red, green, or blue light. Because the digital image output from the image sensing device 10 has multiple different types of photosites (fast and slow, or red, green and blue each existing as fast and slow photosites) but produces only a single value at each pixel location, the digital image is a sparsely sampled digital image. However, it is desirable to obtain a pixel value corresponding to an exposure for each of the red, green, and blue exposures at each photosite location. The pixel values of the sparsely sampled high resolution digital image output from the A/D converter 14 constitute a sparsely sampled image having red, green, and blue pixel values at neighboring pixel locations.

In this description, "red", "green", and "blue" represent the primary spectral sensitivities of an image sensing device 10, as is well known in the art of image processing. The CFA interpolator 26 generates from the image signal output from the A/D converter 14 an interpolated image signal consisting of a pixel value corresponding to the color primaries for each photosite. For example, if a particular photosite is coated with a red filter, then the A/D converter 14 outputs a red pixel value for that photosite since the red filter essentially blocks green and blue light from that particular photosite. The CFA interpolator 26 calculates a green pixel value and blue pixel value for the corresponding photosite even though the corresponding photosite does not respond to green and blue light. Similarly, the CFA interpolator 26 calculates a green pixel value and a red pixel value corresponding to the blue photosites, as well as a red pixel value and blue pixel value corresponding to the green photosites. The operation of the CFA interpolator 26 can be combined with the DREFA processor 22. Conceptually, the CFA interpolator 26 and the DREFA processor 22 perform distinct operations and for the purpose of clarity are not combined in this embodiment.

Generally, the CFA interpolator 26 operates by considering the pixel values of the corresponding photosite and the pixel values of associated surrounding photosites. While any commonly known interpolator may be used, a description of a preferred CFA interpolator is disclosed in. U.S. Pat. No. 5,652,621 issued Jul. 29, 1997 to Adams et al., which is incorporated herein by reference. Adams et al. describe an apparatus for processing a digitized image signal obtained from an image sensor having color photosites aligned in rows and columns that generate at least three separate color values but only one color value for each photosite location, and a structure for interpolating color values for each photosite location so that it has three different color values. The apparatus generates an appropriate color value missing from a photosite location by the interpolation of an additional color value for such photosite locations from color values of different colors than the missing color value at nearby photosite locations. The CFA interpolator 26 based on the Adams apparatus also obtains Laplacian second-order values, gradient values and color difference bias values in at least two image directions from the pixel values corresponding to nearby photosites of the same column and row and selects a preferred orientation for the interpolation of the missing color value based upon a classifier developed from these values. Finally, the missing color pixel value from nearby multiple color pixel values is selected to agree with the preferred orientation.

The sparsely sampled high resolution digital image output from the A/D converter 14 is received by the DREFA processor 22 which expands the dynamic range of the image signal to create a modified image signal having an expanded dynamic range. In the preferred embodiment, the dynamic range of the image sensing device 10 is expanded by designing certain photosites of the image sensing device 10 to have a slow response. The arrangement of the slow response photosites with respect to the image sensing device 10 will be discussed in greater detail hereinbelow. The responses of the slow response photosites are slowed, or retarded, by altering the gain of the selected photosites, herein referred to as slow photosites. Altering the gain of a photosite is commonly practiced in the art of digital camera design and manufacture.

Figure 2:
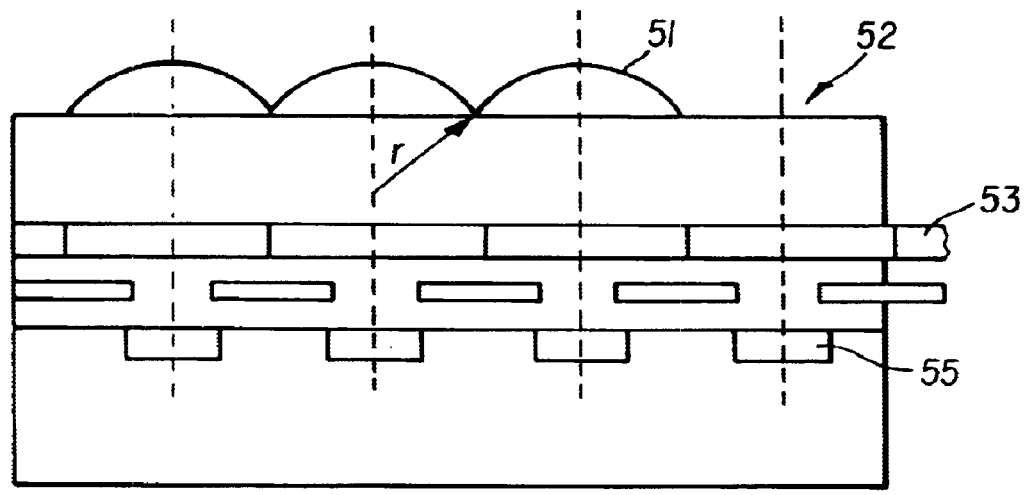
FIG. 2 is a cross-section of an interline image sensor employing an array of lenslets to alter the response of selected photosites.

With reference to FIG. 2, an image sensing device is provided with a color filter array 53. It is a common practice in the art of image sensor manufacture to place resin lenslets 51 on top of each photosite. For example, particularly when the image sensing device 10 is an interline solid state image sensing device, one such lenslet technique is described in U.S. Pat. No. 4,667,092 issued May 19, 1987 to Ishihara, which is incorporated herein by reference. Ishihara discloses a solid-state image device which includes an image storage block having a block surface and a plurality of storage elements embedded along the block surface to store an image in the form of electric charge. An overlying layer is deposited to form an array of optical lenses in correspondence to the storage elements. An intermediate layer is laid between the block surface and the overlying layer. Incident light focuses through lenses and the intermediate layer onto the storage elements. The intermediate layer serves as an adjusting layer for adjusting the focal length of the lenslets.

Figure 3:
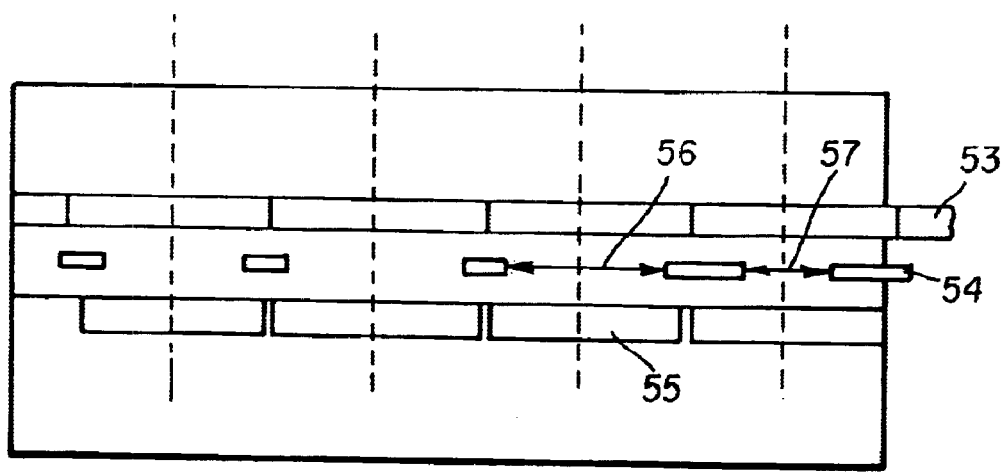
FIG. 3 is a cross-section of a full frame image sensor employing a metal mask to alter the response of selected photosites.

FIG. 2 shows a cross section of an interline solid state image sensing device. Without the lenslets 51, the signal readout area associated with each photosensitive area 55 of a photosite makes it impossible to use the whole area of the semiconductor substrate as the photoelectric transducer area. The conventional solid-state image device does not effectively utilize all incident rays thereon and therefore has low sensitivity. The addition of a resin lenslet 51 on top of a photosite allows the incident rays of light to be focused on the photoactive areas of the photosite, thereby more effectively utilizing the incident rays of light and increasing the sensitivity of the photosite. Thus, by varying the size and/or efficiency of the lenslet 51, the sensitivity (gain) of the photosite may be easily altered. Thus, for interline devices and for CMOS sensors the preferred method of altering the gain of the photosite is by altering the lenslet 51 placed on top of the photosite. As shown in FIG. 3, the location 52 has no lenslet, and therefore fewer incident rays of light are incident on the photosensitive area. Alternatively, a lenslet could be manufactured at location 52 with a different radius, shape, size or material as compared with the lenslet 51, thereby structured to be less efficient at focusing incident rays of light onto the photosensitive area 55 than is the lenslet 51. Those skilled in the art will recognize that if the lenslet 51 focuses 80% of the incident rays of light onto a photosensitive area 55 and the location 52 having no lenslets (or alternatively slow lenslets) allows 20% of the incident rays of light onto a photosensitive area 55, then the photosite covered by lenslet 51 is 2 stops faster than the location 52. In this case, the lenslet 51 is used for fast photosites and no lenslet is used for slow photosites, as represented by location 52.

With reference to FIG. 3 showing a cross section of a full frame image sensing device 10, in the case where the image sensing device 10 is a full frame device, light rays incident to the photosensitive area 55 of a photosite must pass through an aperture of a light shield, typically made from metal, which is shown in cross-section in FIG. 3 to comprise light blocking mask portions 54 and large and small apertures 56 and 57 interspersed among the light blocking portions. In the preferred embodiment, the gain of photosites may be altered by modifying the light blocking mask portion 54. The sensitivity of the photosite is then directly related to the aperture of the light blocking mask portion 54. For example, one photosite with an aperture 50% of the size of a second photosite's aperture will have a response of 50% compared to that on the second photosite. For example, a large aperture 56 of a light blocking mask portion 54 allows 80% of the light rays incident upon that photosite to pass through, but a small aperture 57 allows only 20% of the incident light rays to pass. Those skilled in the art will recognize that the photosite with the large aperture 56 is 2 stops faster than a photosite with the small aperture 57. In this case, the large aperture 56 is used for fast photosites, and the small aperture 57 is used for the slow photosites. Thus, the aperture of the light blocking mask may be modified to adjust the response of the selected photosites. The Eastman Kodak Company makes full frame image sensing devices with a metal mask light shield that reduces the pixel active area of all pixels from about 80% to about 20% (for dithered scanner applications where the sensor is moved by ½ the pixel spacing horizontally and vertically, and 4 pictures are taken). The technique thus involves utilizing such mask technology, but with different sized apertures, to provide an image sensor with a differential response to image light.

Figure 4:
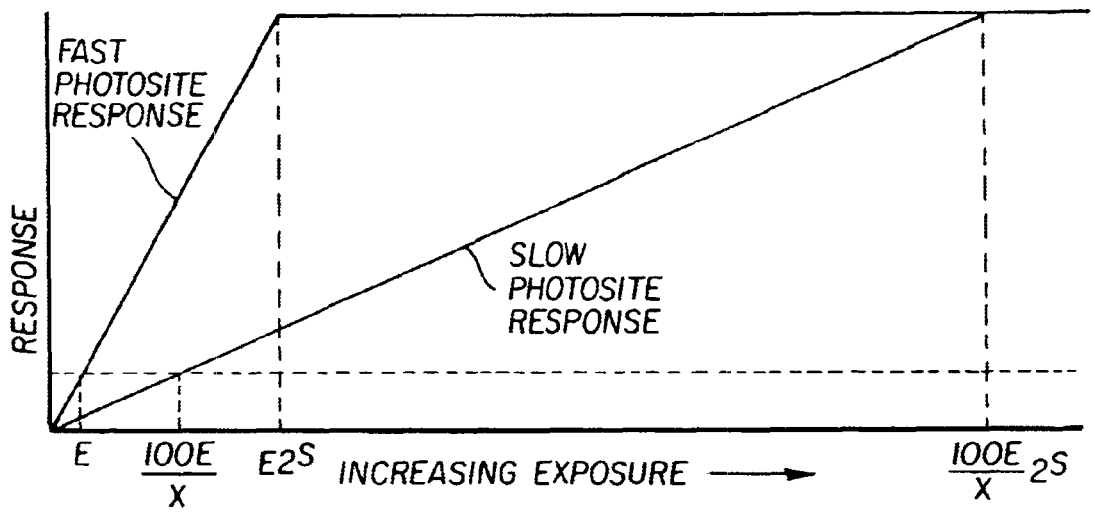
FIG. 4 is a graph illustrating the response of a fast photosite and a slow photosite.

In the preferred embodiment, the response of the selected slow photosites is X % (where X<=100) that of fast photosites for the same exposure, as shown graphically in FIG. 4. In this preferred embodiment, the selected photosites have a response that is slowed by two stops (−log X/100) relative to the fast photosites, resulting in X=25. Thus, the image sensing device 10 consists of multiple sets of photosites, fast photosites and slow photosites. The collection of the output responses of the fast photosites constitutes a sparsely sampled fast digital image, i.e. a sparsely sampled version of a scene sensed with the fast photosites. Likewise, the collection of the output responses of the slow photosites constitutes a sparsely sampled slow digital image, i.e. a sparsely sampled version of a scene sensed with the slow photosites.

Figure 5:
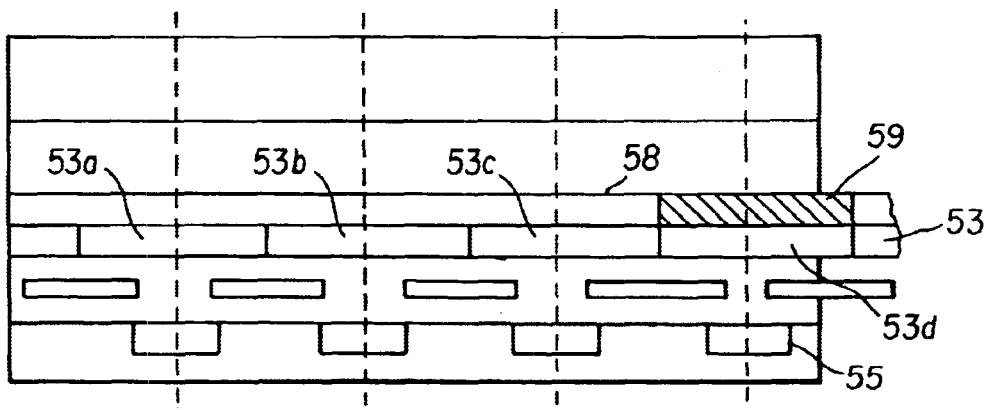
FIG. 5 is a cross-section of an image sensor employing an array of neutral density filters to alter the response of selected photosites.

As another alternative, the responses of the selected slow photosites can be slowed by the use of a neutral filter coating the photosite. FIG. 5 shows a cross section of an image sensing device with a color filter array 53. Note that the color filter array 53a is red, 53b is green, 53c is red, and 53d is green. A layer of neutral filters 58 is contained above the color filter array 53, although the position of the layer of neutral filters 58 and the color filter array 53 does not matter. Note that the layer of neutral filters 58 only contains a neutral filter at the positions of selected photosites, as indicated by the neutral filter 59. In this case, the layer of neutral filters 58 is transparent or nearly transparent for fast photosites and contains a neutral filter 59 for slow photosites. For example, if the neutral filter 59 consists of a material that allows X % transmission of light, then the response of that slow photosite will be slowed by $$\log_2\left(\frac{X}{100}\right)$$

stops relative to the response of the fast photosite.

The DREFA processor 22 shown in FIG. 1 is described in more detail hereinbelow. The purpose of the DREFA processor 22 is to create a modified image signal with an increased dynamic range by processing the input image signal while accounting for the difference in photo response of the fast and slow photosites. Accordingly, the output of the DREFA processor 22 is a modified image signal having increased numerical dynamic range. This modified image signal is then input to the CFA interpolator 26 for processing as previously described.

It is not a requirement of the present invention that the A/D converter 14 and the DREFA processor 22 be directly connected. The DREFA processor 22 may reside in hardware or software in close proximity to the A/D converter 14 and image sensing device 10. For example, the DREFA processor 22 could reside directly within a digital camera. However, the DREFA processor 22 may also be remote from the image sensing device 10. For example, the image signal output from tie A/D converter 14 can be transmitted (after compression) via a wire or wireless connection to a personal computing device, printer, or remote server to apply to operation of the DREFA processor 22. Transmission of the image signal may also include file transfer protocol or email.

Figures 6A, 6B, 7:
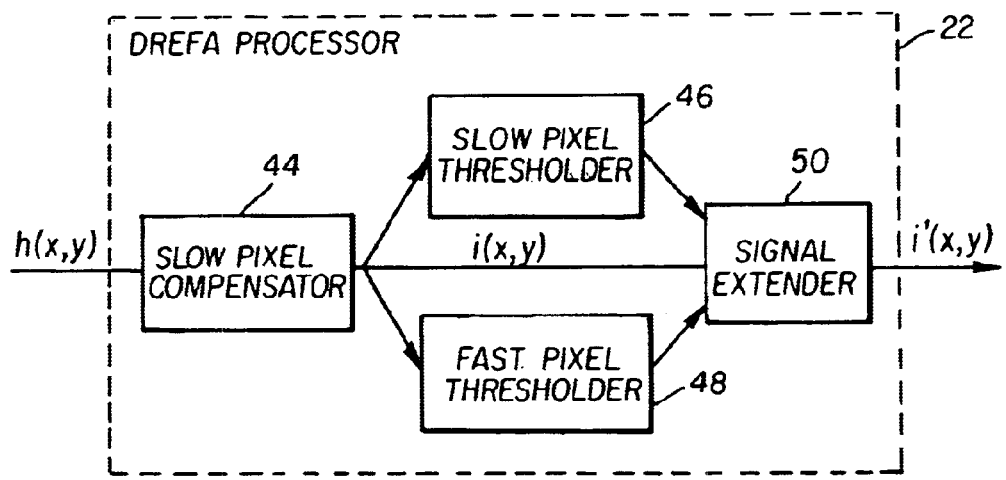
FIG. 6A illustrates the arrangement of slow photosites and fast photosites on a panchromatic image sensing device.
FIG. 6B illustrates the arrangement of slow photosites and fast photosites on a color image sensing device.
FIG. 7. shows an exploded block diagram of the dynamic range extending filter array (DREFA) processor shown in FIG. 1.

In the preferred embodiment, 50% of the photosites of the image sensing device 10 are selected to have slow response. Those skilled in the art will recognize that the relative percentages of slow and fast pixels is not critical, and that the advantages of the present invention can be achieved with various relative percentages of fast and slow photosites. In the case of an image sensing device 10 in which all photosites have approximately equivalent spectral sensitivity (i.e. a panchromatic image sensing device), FIG. 6A shows an arrangement of the slow photosites that will result in approximately 50% of all the photosites of the image sensing device 10 being of slow response. The photosites 28 with slow response are marked with an asterisk (*), while the photosites 30 having fast response are blank. A sparsely sampled image was previously defined as an image that was captured with an image sensing device 10 having a color filter array. According to the present invention, the term sparsely sampled is also intended to refer to an image produced by an image sensing device such as that shown in FIG. 6A where the fast and slow photosites are interspersed. Additionally, an image sensing device 10 such as shown in FIG. 6A having fast photosites with a predetermined response to light exposure interspersed with slow photosites having a slower response to the same light exposure is a sparsely sampled extended dynamic range image sensing device.

FIG. 6B shows an arrangement for a color image sensing device 10 wherein 50% of each photosite type (red, green, or blue sensitive) has slow response. For example, the photosites 32, 34, and 36 are red, green, and blue photosites, respectively, having slow responses; the photosites 38, 40, and 42 are red, green, and blue photosites, respectively, having fast responses. Note that the image sensing device 10 is also a sparsely sampled extended dynamic range image sensing device according to the previous definition.

Note that FIGS. 6A and 6B imply a regular pattern for the location of the slow photosites. While it is preferable that the slow photosites are arranged in a regular pattern, it is by no means necessary. The slow photosites could be arranged randomly or semi-randomly over the surface of the image sensing device 10, and their location would be stored in some place accessible to the DREFA processor 22.

Referring again to FIG. 4, the response of a fast photosite to a certain exposure and the response of a slow photosite to the same exposure are shown. Note that if a level of noise n is superimposed on the response, it can easily be seen that the fast photosite will yield a valid signal with lower exposures (beginning at exposure level E) than will the slow photosite $$\left(\text{which yields valid signal beginning at } \frac{100}{X}E.\right)$$

Alternatively, data from the slow photosite will be valid for higher exposure levels (up to signal level of $$\frac{100}{X}E2^S,$$

where S is the inherent dynamic range of a single photosite, typically S may be about 5 stops) than would the fast photosite (which produces valid response up to an exposure of $E2^S$). Note that both the fast photosite and the slow photosite have the same range of response in stops of exposure (S), but the response of the slow photosites is preferably $$\log_2\left(\frac{X}{100}\right)$$

stops slower than the fast photosites, as shown in FIG. 4. It is preferred that the responses of the fast and slow photosites overlap with respect to exposure. That is, it is preferred that $$\log_2\left(\frac{X}{100}\right) < S.$$

The overall dynamic range of the image sensing device 10, considering both fast and slow photosites, is S−

$$\log_2\left(\frac{X}{100}\right)$$

In the case of the preferred embodiment, where S=5 and X=25, the overall effective dynamic range of the image sensing device 10 is 7 stops of exposure.

The DREFA processor 22 may be utilized to extend the overall dynamic range of the digital images produced with the present invention by using the pixel values corresponding to slow photosites to reconstruct the image signals in regions corresponding to very high exposures. Likewise, the DREFA processor 22 also uses the pixel values corresponding to photosites with fast response to reconstruct the image signal corresponding to very low exposures.

FIG. 7 shows a block diagram of the DREFA processor 22. The sparsely sampled high resolution digital image, which is a logarithmic image signal h(x,y) output from the A/D converter 14, is passed to the slow pixel compensator 44. The purpose of the low pixel compensator 44 is to compensate the image signal corresponding to slow photosites by accounting for the offset in response by X stops. Alternatively, the fast pixels can be equalized to the slow pixels by adjusting the fast pixels in the opposite direction. In the preferred embodiment, the image signal corresponding to the slow photosites are incremented by the quantity— cvs log (X/100), where cvs is the number of code values per stop of exposure. In the referred embodiment, the quantity cvs is 51. Alternatively, if the image signal input to the slow pixel compensator 44 is linearly related to exposure (rather than logarithmically), then the slow pixel compensator 44 scales the image signal corresponding to the slow photosites by a factor of 100/X. Note that it is assumed that the locations of the slow photosites are known to the slow pixel compensator 44. The output of the slow pixel compensator 44 is an image signal i(x,y) that has been compensated at locations corresponding to slow photosites for the difference between the slow photosite response in relation to the fast photosite response. At the locations corresponding to fast photosites, the value of the image signal h(x,y) output from the A/D converter 14 is identical to the value of the image signal i(x,y) output from the slow pixel compensator 44. Note that the image signal i(x,y) is not limited to an 8 bit range. In the referred embodiment, the value of i(x,y) ranges from 0 to 357 (i.e. 9 bits).

Next, the image signal i(x,y) output from the slow pixel compensator 44 is input to a slow pixel thresholder 46. The purpose of the slow pixel thresholder 46 is to determine slow pixel values that are of low quality due to a photosite not receiving enough photons to produce a valid signal. The pixel value at these (x,y) locations is then replaced in processing performed by the signal extender 50 by calculating a new pixel value based upon nearby fast pixel values. All slow pixel values which are less than a predetermined threshold are considered to be problem pixel values. In the case of the slow pixel values, this predetermined threshold is referred to as the low exposure response threshold. Thus, a pixel value i(x,y) is considered to be a problem if it is a slow photosite and if:

$$i(x,y) < T_1 \quad (2)$$

where $T_1$ is predetermined. In the preferred embodiment, the value of $T_1$ is given by $$T_1 = -cvs\log_2\left(\frac{X}{100}\right), \quad (3)$$

which in the preferred embodiment is set to a value of 102. Note that the threshold $T_1$ may be dependent upon the color sensitivity of the photosite at location (x,y). Slow pixel values that are problems are referred to as noise pixels, since the value of i(x,y) is not sufficiently above the noise level of the image sensing device to be useful.

Likewise, the image signal i(x,y) output from the slow pixel compensator 44 is input to a fast pixel thresholder 48. The purpose of the fast pixel thresholder 48 is to determine fast pixels that are of low quality. The pixel values at these locations is then replaced by calculating a new pixel value based upon nearby slow pixel values in processing performed by the signal extender 50, which will be described in detail hereinbelow. All fast pixel values that are greater than a predetermined threshold value are considered to be problem pixels. In the case of the fast pixels, this predetermined threshold used for the purpose of detecting problem fast pixels is referred to as the high exposure response threshold. Thus, a fast pixel value i(x,y) is considered to be a problem if:

$$i(x,y) > T_2 \quad (4)$$

where $T_2$ is a predetermined threshold. In the preferred embodiment, the value of $T_2$ is set to a value of 254. Note that the threshold $T_2$ may be dependent upon the color of the photosite at location (x,y). Fast photosites that are problem locations are referred to as saturated pixels, since the value of i(x,y) is as high as possible at these locations.

The (x,y) locations of the problem slow pixels determined by the slow pixel thresholder 46 and the (x,y) locations of the problem fast pixels determined by the fast pixel thresholder 48 are input to the signal extender 50. In addition, the image signal i(x,y) output from the slow pixel compensator 44 is also input to the signal extender 50. The purpose of the signal extender 50 is to replace the image signal i(x,y) values at problem locations (x,y) with estimates of the signal herein referred to as replacement values, had the inherent dynamic range of each photosite of the image sensing device 10 been greater. If the problem location is coincident with a slow photosite, then the replacement value is calculated from neighboring image signal pixel values coincident with fast photosites. In this embodiment, the term "neighboring" refers to a certain spatial distance. In the preferred embodiment, the photosites neighboring a selected photosite are those photosites within a distance of 2 photosites of the selected photosite. Likewise, if the problem location is coincident with a fast photosite, then the replacement value is calculated from neighboring image signal values coincident with slow photosites. In the preferred embodiment, the color of the photosite at the problem photosite is also taken into account. The replacement value for any problem location is preferably determined only by the signal originating from neighboring photosites of the same color. The output of the signal extender 50 is an image signal i'(x,y) having a dynamic range as if captured by an image sensing device 10 having photosites with inherent dynamic range of $$S = -\log_2\left(\frac{X}{100}\right) \quad (5)$$

rather than the actual inherent dynamic range of S for each photosite of the image sensing device 10. Note that for all (x,y) locations that are not problem locations, the value of i'(x,y) is equivalent to i(x,y).

As an example of the processing performed by the signal extender 50 for the Bayer CFA pattern shown in FIG. 6B, if location (x,y) is a problem location, and (x,y) is the location that corresponds to a green photosite (such as photosite 34 in FIG. 6B), then the replacement value i'(x,y) for the image signal i(x,y) is calculated in the following manner:

$$i'(x,y)=0.25*[i(x-1,y-1)+i(x+1,y-1)+i(x-1,y+1)+i(x+1,y+1)] \quad (6)$$

Note that signal values that the calculation of i'(x,y) is dependent upon, are expected to comply with certain requirements. For example, suppose that (x,y) is a problem location and (x,y) corresponds to a green photosite with slow response. Then the signal levels of neighboring photosites are used to calculate replacement value i'(x,y). However, this assumes that the signal values of each of the neighboring photosites are also less than $T_3$. In the preferred embodiment, $T_3=T_1$. For each neighboring photosite that this is not the case, that signal level is omitted from the calculation of the replacement value i'(x,y). For example, if i(x−1, y−1)>$T_3$, then the value i'(x,y) is calculated with the following formula:

$$i'(x,y)=\tfrac{1}{3}*[i(x+1,y-1)+i(x-1,y+1)+i(x+1,y+1)] \quad (7)$$

Generally, the interpolation scheme for determining a replacement value at problem location (x,y), where the location (x,y) corresponds to a green photosite which is also a fast photosite on a image sensing device having a Bayer pattern filter array is given with the following equation:

$$i'(x, y) = \frac{\sum_{j=-1,1}\sum_{k=-1,1} i(x+j, y+k)W(x+j, y+k)}{\sum_{j=-1,1}\sum_{k=-1,1} W(x+j, y+k)} \quad (8)$$

where $$W(x+j, y+k) = \begin{cases} 1 & i(x+j, y+k) > T_3 \\ 0 & \text{otherwise} \end{cases} \quad (9)$$

Note that the same equation is applied to determine the replacement value if the problem location corresponds to a green photosite which is also a slow photosite. However, in this case:

$$W(x+j, y+k) = \begin{cases} 1 & i(x+j, y+k) < T_4 \\ 0 & \text{otherwise} \end{cases}, \quad (10)$$

where in the preferred embodiment, $T_4=T_2$.

As another example, also in connection with the Bayer CFA pattern shown in FIG. 6B, if location i(x,y) is a problem photosite and (x,y) corresponds to a location of a red or blue photosite, then the replacement value i'(x,y) for the image signal i(x,y) is calculated in the following manner:

$$i'(x,y)=0.25*[i(x-2,y)+i(x+2,y)+i(x,y+2)+i(x,y-2)]. \quad (11)$$

When location (x,y) corresponds to a red or blue photosite and is also a fast photosite, the equation for determining the replacement value i'(x,y) may be generalized as follows:

$$i'(x, y) = \frac{\sum_{j=-2,0,2}\sum_{k=-2,0,2} i(x+j, y+k)W(x+j, y+k)}{\sum_{j=-2,0,2}\sum_{k=-2,0,2} W(x+j, y+k)} \quad (12)$$

where $$W(x+j, y+k) = \begin{cases} 1 & i(x+j, y+k) > T_3 \\ 0 & \text{otherwise} \end{cases} \quad (13)$$

Note that in this case, either j or k must be 0, but j and k are never both zero. Note also that the same equation is applied to determine the replacement value if the problem location corresponds to a red or blue photosite which is also a slow photosite. However, in this case $$W(x+j, y+k) = \begin{cases} 1 & i(x+j, y+k) < T_4 \\ 0 & \text{otherwise} \end{cases}, \quad (14)$$

where in the preferred embodiment, $T_4=T_2$.

The interpolation scheme described above for the purpose of generating an image signal with an extended dynamic range from more than one sparsely sampled image signal may be modified by those skilled in the art. However, many such modifications to the above interpolation scheme may be derived and should not be considered as significant deviations of the present invention.

Those skilled in the art will recognize that the above interpolation scheme performed by the signal extender is a lowpass filter, which is well known in the art. Typically, the application of a lowpass filter to a digital image signal has a similar effect to reducing the resolution of the digital image signal. Thus, the processing performed by the DREFA processor 22 is a method by which the spatial resolution of the image sensing device 10 may be traded for dynamic range of the image sensing device 10. Indeed, those areas of an image where the interpolation scheme is implemented to increase the dynamic range of the signal appear noticeably softer (less sharp) than the image would have if that same area of the image had been captured by the sensor in such a fashion that no "problem locations" (as defined by the slow thresholder 46 and the fast thresholder 48) occur.

The result of this approach is an extended dynamic range digital image such as output from the DREFA processor 22 or the CFA interpolator 26, having a larger dynamic range than that associated with the an image sensing device comprised solely of fast photosites. This additional dynamic range can result in improved image quality in many applications. Particularly when the extended dynamic range image information can be used with advanced image processing algorithms designed to improve high dynamic range images such as was described in the introduction. However, users of digital imaging devices, such as digital cameras, are accustomed to receiving digital images that are stored in a color encoding that will produce a pleasing image when displayed directly on a typical CRT monitor. Typically, this arrangement is convenient for many typical work-flows, and is desirable in many cases to maximize compatibility and interoperability. CRT monitors also have a substantially limited color gamut relative to the color gamut of many common image sensing devices, and particularly relative to the extended dynamic range digital images described above. (The color gamut of an imaging device refers to the range of colors and luminance values that can be produced by the device. The dynamic range is one aspect of color gamut relating to the range of luminance values that can be produced by the device.) The process of converting the color values captured by an image sensing device to those appropriate for display on a particular output device is often referred to as "rendering." The rendering process will typically result in a significant loss of image data corresponding to areas of the scene having colors outside the color gamut of the rendered space. Thus, if an extended dynamic range image is created using the method of the present invention, the extra dynamic range may not be enjoyed, appreciated, or even noticed by the user if the image must be stored in a limited color gamut storage space before the extended color gamut image data can be used to form an improved image.

Figure 8:
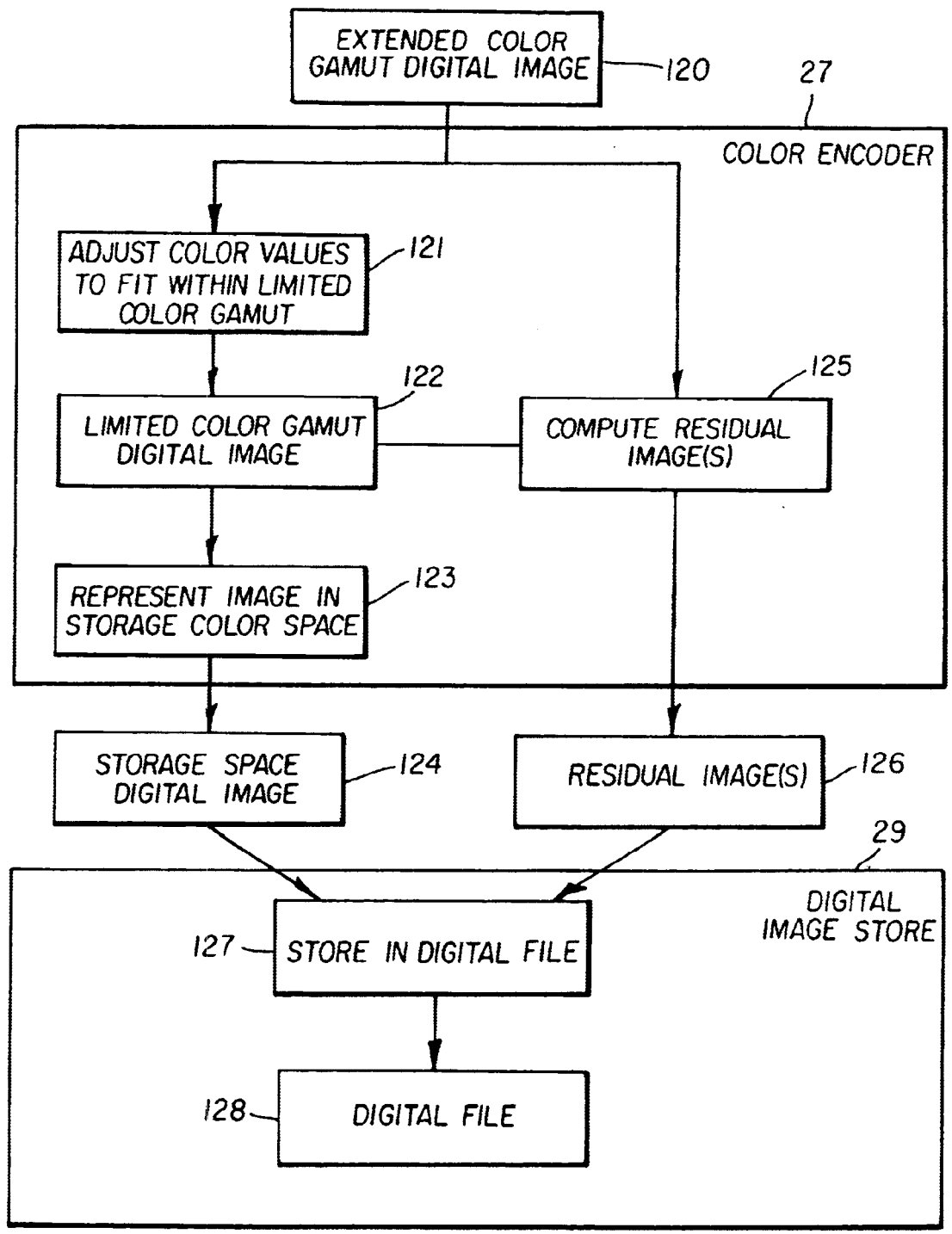
FIG. 8 illustrates a method for storing an extended color gamut digital image as performed by the color encoder 27 and the digital image store 29.

This limitation can be overcome by using the method shown in FIG. 8, representing the function of both the color encoder 27 and the digital image store 29. An extended color gamut digital image 120 has color values that are outside the limited color gamut of a storage color space such as video RGB. The extended color gamut digital image such as the full resolution digital image is output from the digital image processor 200 shown in FIG. 1. An adjust color values step 121 is used to limit the color values to those that will fit within the limited color gamut of the storage color space to form a limited color gamut digital image 122. Next, the image is represented in storage color space 123 to produce a storage space digital image 124. A residual image(s) is computed 125 to determine one or more residual image(s) 126 representing the difference between the extended color gamut digital image and the limited color gamut digital image. The storage space digital image 124 and the residual image(s) 126 are then stored 127 in a digital file 128.

Each of the steps in FIG. 8 will now be discussed in more detail. For many applications, it is convenient to store, display and manipulate the digital image in a particular storage color space that is well-suited for the work flow associated with that application. Note that a storage color space is more generally described by the term storage space. A storage space may be either a monochromatic storage space such as a gray or black and white space, or the storage space may be a storage color space. In the preferred embodiment, the storage space is a storage color space. Frequently, the storage color space that is chosen will be a device dependent color space associated with a common output device or medium used by the system. In many cases, video RGB color spaces are used because they can be displayed or previewed directly on a computer video display without any further processing. Additionally, many software applications that are available to manipulate images on a computer are designed to work with images in a video RGB color space. The color gamut of the storage color space will often be smaller than, or at least different than, the color gamut of the extended color gamut digital image 120. As a result, there generally will be colors in the extended color gamut digital image 120 that cannot be represented in the storage color space. For example, consider the case where the extended color gamut digital image 120 is an extended dynamic range digital image captured by a digital camera having a sensor with fast and slow photosites as described above. There are many colors within the color gamut of the extended dynamic range digital image that are outside the color gamut of the video RGB color space. Therefore, information must be discarded in order to store the extended dynamic range digital image in a video RGB color space, or any other limited color gamut storage space. In the present invention, the information that is lost will be stored in one or more residual image(s).

The color values of the extended color gamut digital image are adjusted 121 to fit within the limited color gamut of the storage space, forming a limited color gamut digital image 122. In this step, information must be discarded when color values that are outside the limited color gamut are mapped to color values within the limited color gamut. In some cases, the color values for the out-of-gamut colors are simply "clipped," i.e., they are mapped to color values on the surface of the limited color gamut. In other cases, more sophisticated gamut mapping methods can be used to compress the extended color gamut into the limited color gamut without introducing a hard clipping function. For example, the chroma of the input color values can be scaled so that the most saturated colors in the extended color gamut are mapped to the most saturated colors in the limited color gamut. Alternatively, a gamut mapping method can be used that is designed to preserve color appearance as closely as possible. Regardless of what gamut mapping technique is used, there will necessarily be a loss of information and a distortion of the color characteristics of the image.

Additionally, it will also typically be necessary to reduce the luminance dynamic range of the extended color gamut digital image. Commonly, one part in the implementation of the adjust color values step 121 will include the application of a tone scale function. The tone scale function maps the input image intensities to output image intensities and might be applied to a luminance channel of the image, or alternatively to each color channel of an RGB color representation.

Once the limited color gamut digital image 122 has been determined, the next step is to represent it 123 in the storage color space. The output of this step is a storage space digital image 124. This step typically involves applying a device model, or a color space conversion, to determine the storage space color values that correspond to the adjusted color values of the limited color gamut digital image 122. For example, if the adjusted color values were specified in terms of the CIELAB color space, a video display device model can be used to determine the corresponding video RGB values that would be necessary to produce the specified adjusted color values.

One or more residual image(s) 126 representing the difference between the extended color gamut digital image 120 and the limited color gamut digital image 122 are then computed 125. In its simplest form, a single residual image 126 can be calculated by simply subtracting the adjusted color values of the limited color gamut digital image 122 from the input color values of the extended color gamut digital image 120. The residual image would then be in terms of the color space used to represent those color values. Alternatively, the color values can be transformed into some other space that would be useful for computing the residual image. For example, it might be desirable to compute the residual image in a color space that is well-suited for compressing the residual image or that is convenient for use in reconstructing the extended color gamut digital image.

There are several reasons why it may be advantageous to store multiple residual images instead of just a single residual image. For example, it might be desirable to store residual errors associated with luminance errors in one residual image, and residual errors associated with chrominance errors in additional residual images. This would enable an application to make a choice about which types of residual errors it would use during the process of determining a reconstructed extended color gamut digital image.

In another case, a set of multiple residual images can correspond to different subsets of extended dynamic range image data. For example, a first residual image can extend the dynamic range of the digital image some fixed amount beyond the dynamic range associated with the limited color gamut digital image. A second residual image can then extend the dynamic range an additional increment beyond the extended dynamic range associated with the first residual image. In this way, an application using the extended color gamut digital image can use only the residual image(s) associated with the amount of extended dynamic range required by the application.

Another reason that using multiple residual images is useful is for cases where the residual images are stored in tags in the digital file having a limited size. In this case, the residual image data can be broken into smaller pieces that would fit within the size limitations. For example, residual images can be determined for subsets of pixels in the extended color gamut digital image. In this way, the residual image data can be stored in a tiled fashion.

Generally, the extended color gamut digital image and the limited color gamut digital image 122 should be represented in the same color space before the residual image(s) are calculated so that the in-gamut colors will be given by zero residual errors. Since most images will only have a small fraction of color values that are out of gamut, the residual image(s) will be dominated by zeros, and therefore will be highly compressible.

For cases where the adjust color values step 121 involves the application of a transform that modifies the color values for the colors within the limited color gamut as well as those outside the limited color gamut, the residual image is determined by directly computing the difference between the input color values of the extended color gamut digital image and the adjusted color values of the limited color gamut digital image 122 would have a large number of non-zero values. This can be undesirable for cases where the residual image is to be compressed.

Once the residual image(s) 126 have been calculated, they should be associated in some fashion with the storage space digital image 124. This can involve storing the residual image(s) 126 in a memory buffer that is associated with a second memory buffer used to store the storage space digital image 124. Alternatively, many applications will store the image data in a digital file 128 on some sort of digital storage media such as a magnetic disk, an optical disk, or a PCMCIA card using a digital file storage step 127. In this case, the storage space digital image 124 and the residual image(s) 126 can be stored in two different files, or can be stored in the same digital image file. In many cases, the file format used to store the storage space digital image 124 may support the use of private image tags. For example, the file formats TIFF, EXIF and FlashPix all support tags of this sort. These tags are sometimes referred to as meta-data. In cases where file formats of this type are used, it will be convenient to store the residual image data in the form of a residual image tag. In this way, applications that do not know how to make use of the residual image tag will simply ignore it, and will therefore have access only to the storage space digital image 124, whereas applications that know how to use the residual image tag will be able to make use of it to reconstruct the extended color gamut digital image. Some file formats place a limit on the size of tags, so compression of the residual image is important for these applications.

For the remainder of this disclosure, the case of a single residual image will be described. However, it should be recognized that the method can be easily generalized to use a set of multiple residual images.

Figure 9:
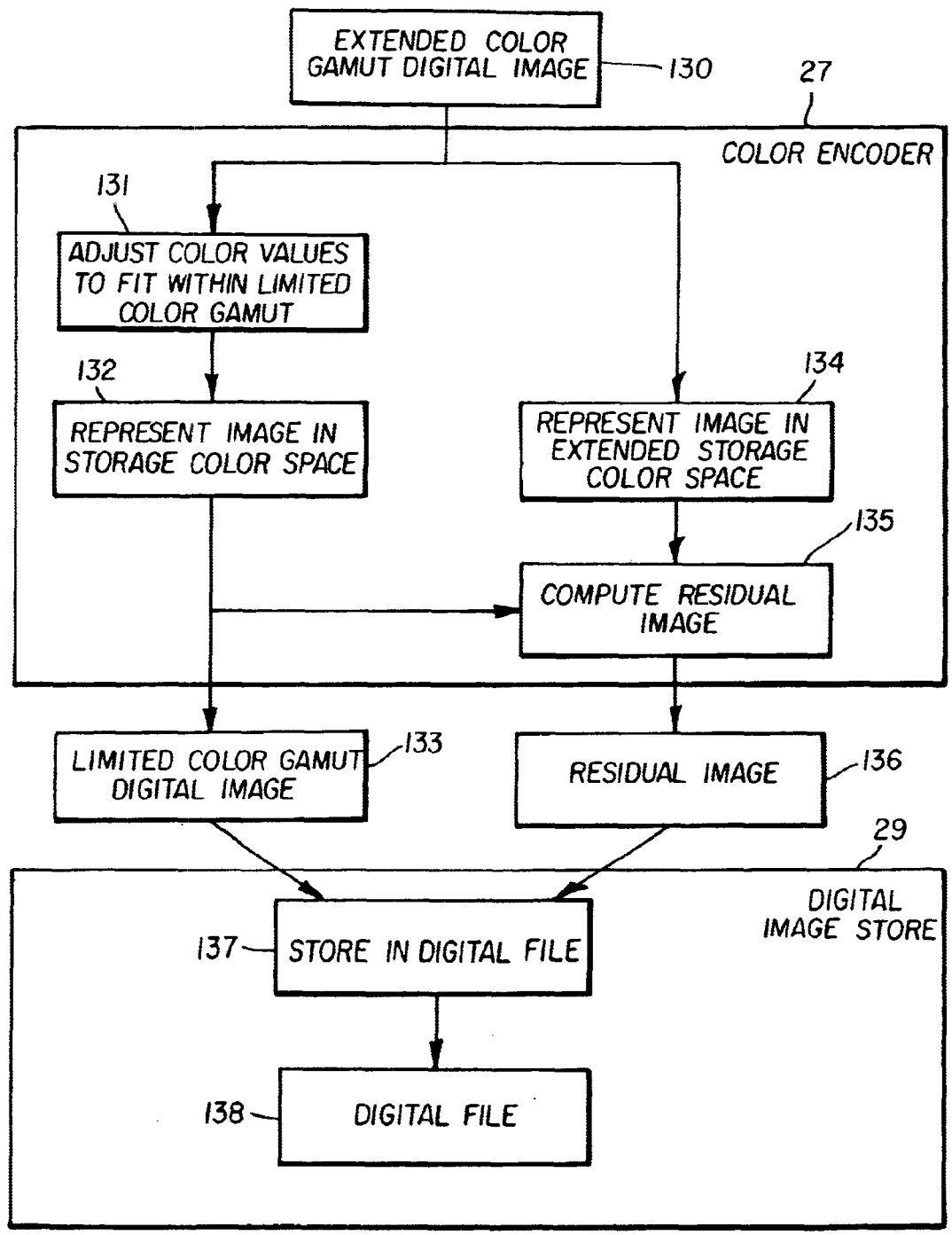
FIG. 9 illustrates another method for storing an extended color gamut digital image as performed by the color encoder 27 and the digital image store 29.

A second method of storing a digital image in accordance with the present invention is shown in FIG. 9, representing the function of both the color encoder 27 and the digital image store 29. This embodiment is similar to that shown in FIG. 8 but differs in the way that the residual image is determined. In this second embodiment, the residual image is represented relative to the code values of the storage color space. FIG. 9 shows an extended color gamut digital image 130, having color values that are outside the limited color gamut of a storage color space. The color values are adjusted 131 to limit the color values to those that will fit within the limited color gamut of the storage color space. Next, the image is represented 132 in storage color space to produce a limited color gamut digital image 133. The image is then represented in extended storage color space 134 and a residual image is computed 135 to produce a residual image 136 representing the difference between the extended color gamut digital image and the limited color gamut digital image, both being encoded according to the storage color space. The limited color gamut digital image 133 and the residual image 136 are then stored in a digital file 138 using a digital file storage step 137.

Since most of the steps in this second method are identical to the corresponding steps in the first method, only the steps that differ will be discussed in more detail. The primary difference between the two methods is that the residual image is computed relative to the storage color space color values in this case. Therefore, the original extended color gamut digital image must be transformed to the storage color space in addition to the limited color gamut digital image. This is accomplished by representing 134 the image in extended storage color space. The complication is that the storage color space will typically only have a limited color gamut. For example, if the storage color space is a video RGB color space, then the color gamut of the storage space can be limited to the color gamut of the video display. Therefore, to represent the original extended color gamut digital image in the storage color space, it is necessary to define an extended version of the storage color space that does not impose the limited color gamut. For example, 24-bit video RGB color spaces usually encode the color values in terms of integer code values in the range of 0 to 255. In order to allow the encoding of colors outside the color gamut of the video display, the original extended color gamut digital image can be represented in an extended storage space where the code values were allowed to go outside the range 0 to 255. This would permit the encoding of colors with higher chroma values, as well as larger luminance dynamic range values, than can be encoded directly in the storage color space. After both the limited color gamut digital image and the extended color gamut digital image have been represented in terms of the storage color space, the residual image 136 is then calculated as before by computing a difference between the two images.

The result of applying the method of the present invention is the creation of both a limited color gamut digital image in a storage color space and an associated residual image which correlates the limited color gamut digital image to an extended color gamut digital image. As discussed previously, the limited color gamut digital image is generally well suited for display on a target output device such as a video display. One advantage of this approach is that systems that cannot make use of the residual image will be able to display and manipulate this image directly with no image quality or computation disadvantage relative to the prior art where only the limited color gamut digital image is stored. However, the information that normally would have been discarded has now been stored in the residual image and is available for use by systems that can utilize it. In this case, the limited color gamut digital image is extracted and the residual image from the digital file is used to form a reconstructed extended color gamut digital image.

Figure 10:
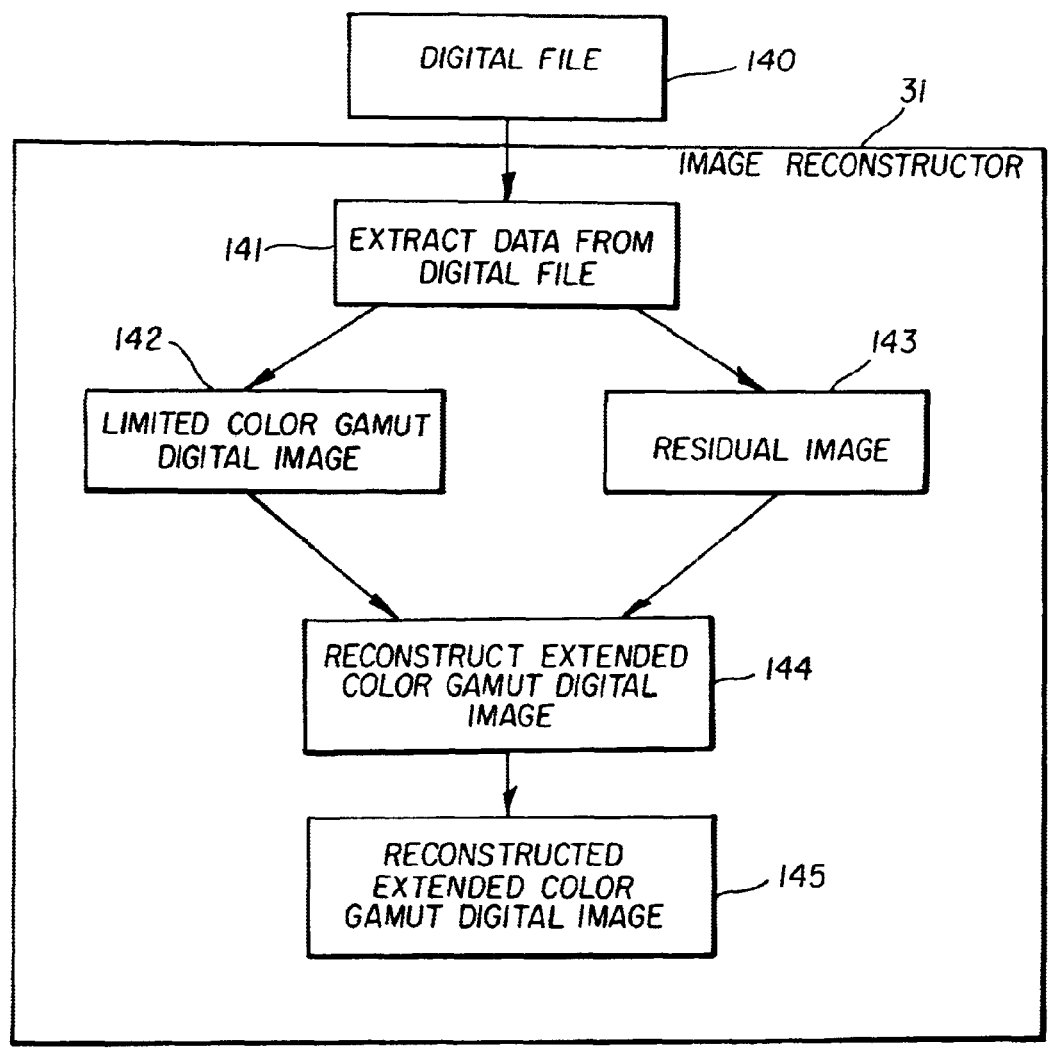
FIG. 10 illustrates a method for forming a reconstructed extended color gamut digital image as performed by the image reconstructor 31.

FIG. 10, representing the function of the image reconstructor 31 shown in FIG. 1, shows an example of reconstructing an extended color gamut digital image from the limited color gamut digital image and the residual image. The input to this process is an extended color gamut digital file 140 containing a limited color gamut digital image and a residual image created as described above. Data is extracted 141 from digital file to produce the limited color gamut digital image 142 and the residual image 143. An extended color gamut digital image is reconstructed 144 to form a reconstructed extended color gamut digital image 145 by combining the limited color gamut digital image 142 and the residual image 143. Typically the reconstruction 144 of the extended color gamut digital image will involve combining the limited color gamut digital image 142 and the residual image 143.

The reconstructed extended color gamut digital image 145 can be used for many different purposes. For example, it can be used to form a digital image appropriate for display on an output device having a color gamut different from the limited color gamut of the limited color gamut digital image 142 in the digital file 140. This enables the generation of an optimal print from the original extended color gamut digital image, rather than a print limited by constraints of the storage color space.

Figure 11:
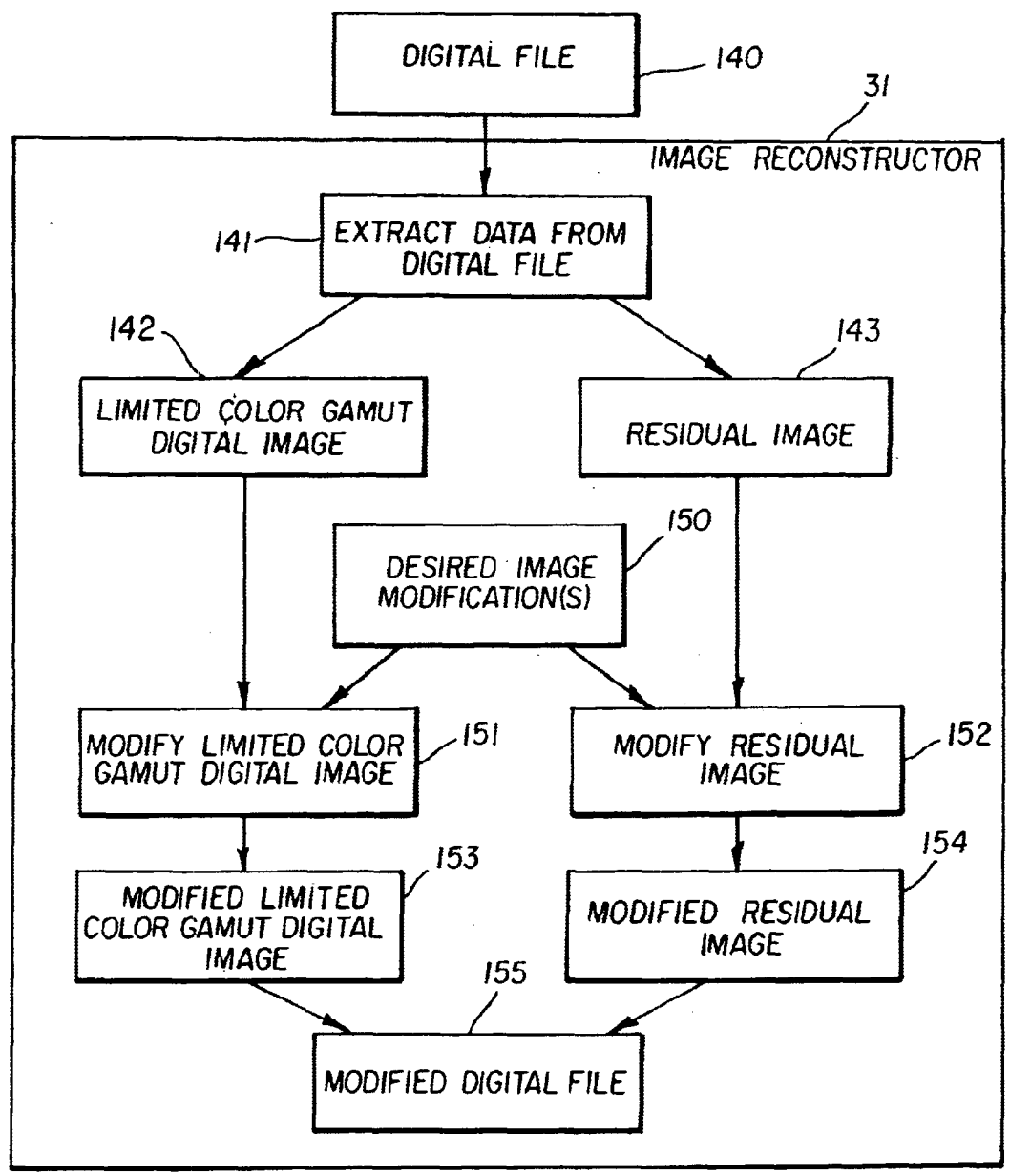
FIG. 11 illustrates a method for forming a modified digital image as performed by the image reconstructor 31.

The information in the extended color gamut is particularly useful during the process of applying a modification to the digital image. Consider FIG. 11, representing the function of the image reconstructor 31 shown in FIG. 1, which shows one method for modifying an extended color gamut digital image in accordance with the present invention. The input to this process is an extended color gamut digital file 140 containing a limited color gamut digital image and a residual image created as described above. As in FIG. 10, an extract data from digital file step 141 is used to extract the limited color gamut digital image 142 and the residual image 143. One or more image modification(s) 150 are then specified to be used to modify the image. The limited color gamut digital image 142 is then modified using a modify limited color gamut digital image step 151 in response to the image modification(s) 150 to form a modified limited color gamut digital image 153. Likewise, the residual image 143 is modified using a modify residual image step 152 in response to the image modification(s) 150 to form a modified residual image 154. The modified limited color gamut digital image 153 and the modified residual image 154 taken together represent a modified extended color gamut digital image which can be stored in a modified digital file 155. Alternatively, the modified digital image can be used to produce an image on a digital printer, or some other form of image display device. The modified digital image can also be transmitted to a remote location for storage or printing at that location. Methods for transmitting the modified digital image can include the use of a computer network connection, or a modem connected to a telephone line.

There are many different types of image modification(s) 150 that can be applied to the digital image. For example, there are many kinds of color and tone reproduction modifications that can be applied to an image. In some cases it will be desirable to adjust the color balance of the image. In other cases it will be desirable to adjust the density of the image so as to produce a darker image or a lighter image. Other types of color and tone reproduction modifications can include changes in the contrast, hue or colorfulness of the image. In some cases, it will also be desirable to modify the color and tone reproduction characteristics to optimize them for a specific output device. The present invention is particularly well-suited to making modifications to the color and tone reproduction characteristics of the image due to the fact that the extended color gamut information stored in the residual image will enable larger changes to be made without any degradation in quality. For example, consider the case where an original image is determined to be over-exposed. In this case, highlight information in the limited color gamut digital image would have been clipped off during the process of rendering the image to the limited color gamut. However, this highlight information would be retained in the residual image. If it were desired to darken the image to correct for the over-exposure error, the information in the residual can then be used to determine a modified digital image that recovers the highlight detail.

Other types of image modifications that can be applied to a digital image include spatial image modifications. Examples of spatial image modifications include zooming, cropping, noise reduction, and sharpening the image. Zooming an image involves a resizing of the image. Cropping an image involves selecting a subset of an image. A noise reduction process generally involves reducing the appearance of image grain or noise by smoothing the image in flat areas of the image. Sharpening an image typically involves applying a spatial convolution to the image to increase the apparent sharpness of edges in the image. There are many other types of image modifications such as those found in common image editing software programs such as the widely used Adobe PhotoShop.

As previously described, the A/D converter shown in FIG. 1 outputs a sparsely sampled high resolution digital image. However, users of digital imaging devices, such as digital cameras, are accustomed to receiving digital images that are stored in a color encoding that will produce a pleasing image when displayed directly on a typical CRT monitor. This necessitates the operation of the digital image processor 200 in order to produce a full resolution digital image. This full resolution digital image is subsequently rendered to a storage color space. Although it is desirable to quickly produce a storage space digital image, the hardware on a digital camera is often of insufficient speed to quickly execute the complex algorithms that might reside within the digital image processor 200 for the purpose of performing the operations of the DREFA processor 22 and the CFA interpolator 26. Typically, simplified algorithms with simpler logic are used to execute the operations of the DREFA processor 22 and the CFA interpolator 26. In general, as the complexity of the digital image processor 200 increases, the potential image quality of the full resolution digital image also increases. Likewise, when the complexity of the digital image processor 200 is simplified for the purposes of hardware architecture cost, the potential image quality of the full resolution digital image decreases. Thus, the full potential of the sparsely sampled high resolution digital image may not be fully enjoyed or noticed by the user if the digital image processor 200 is a simplified version of the ideal algorithms, the simplification performed for reasons of hardware costs, software costs, processing speed, or other related reasons.

Figure 12:
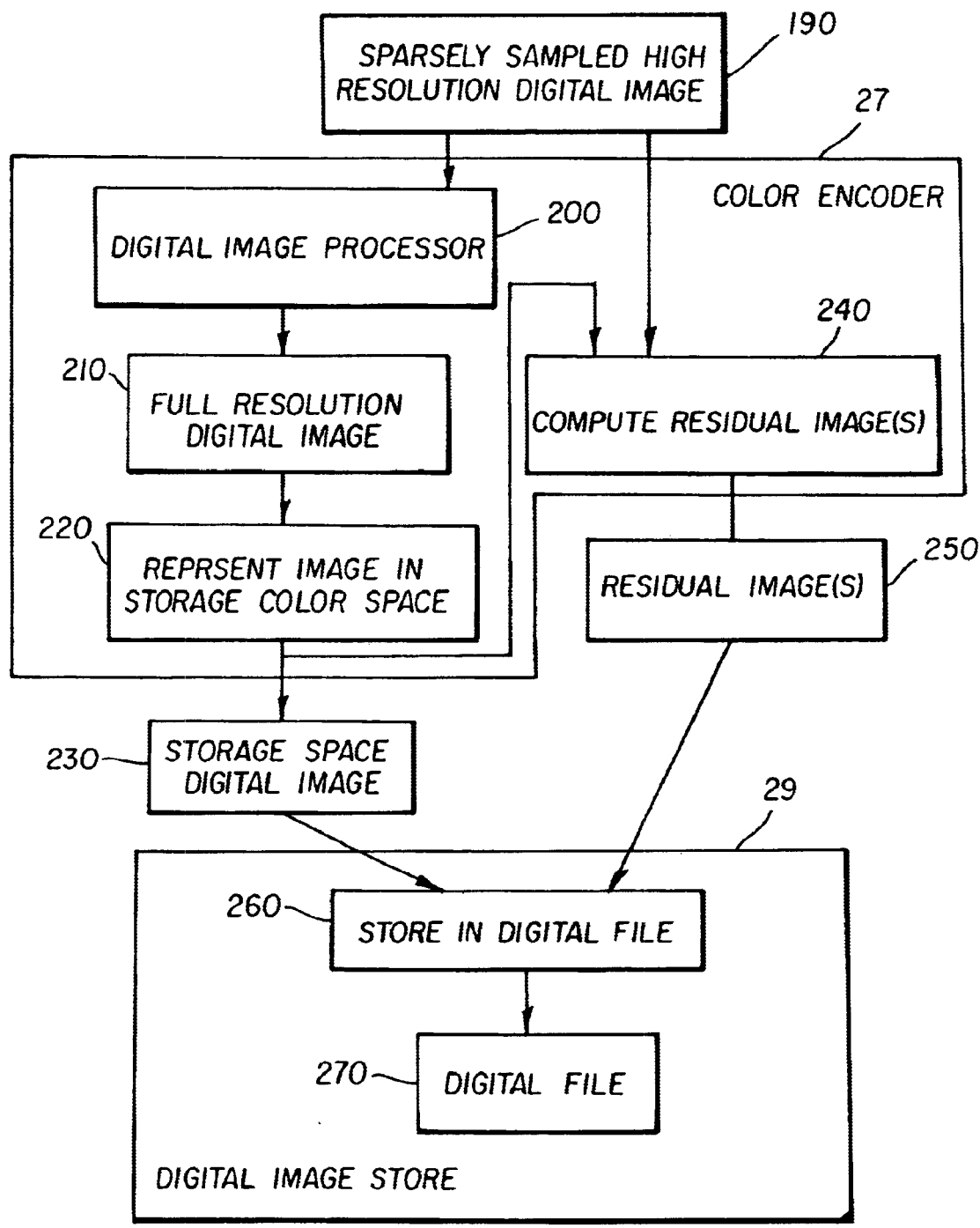
FIG. 12 illustrates a method for storing a sparsely sampled high resolution digital image as performed by the color encoder 27 and the digital image store 29.

This limitation may be overcome by the embodiment shown in FIG. 12, representing the function of both the color encoder 27 and the digital image store 29. This embodiment is similar to that shown in FIGS. 8 and 9. In this embodiment, the residual image represents a residual between a storage space digital image 230 and the sparsely sampled high resolution digital image 190. FIG. 12 shows a sparsely sampled high resolution digital image 190, which is passed to the digital image processor 200 for producing a full resolution digital image 210 as previously described. An image is represented 220 in storage color space to produce a storage space digital image 230. A residual image(s) 250 is computed 240 to represent the difference between the sparsely sampled high resolution digital image 190 and the storage space digital image 230. The storage space digital image 230 and the residual image(s) 250 are then stored 260 in a digital file 270. The digital file 270 may be a digital buffer as before or some applications will store the image data in a digital file 270 on some sort of digital storage media such as a magnetic disk, an optical disk, or a PCMCIA card using a digital file storage step 260. In this case, the storage space digital image 230 and the residual image(s) 250 can be stored in two different files, or can be stored in the same digital image file. In many cases, the file format used to store the storage space digital image 230 may support the use of private image tags. For example, the file formats TIFF, EXIF and FlashPix all support tags of this sort. These tags are sometimes referred to as meta-data. In cases where file formats of this type are used, it will be convenient to store the residual image data in the form of a residual image tag. In this way, applications that do not know how to make use of the residual image tag will simply ignore it, and will therefore have access only to the storage space digital image 230. Whereas applications that know how to use the residual image tag will be able to make use of it to reconstruct the extended color gamut digital image. Some file formats place a limit on the size of tags, so compression of the residual image is important for these applications. Compression techniques disclosed in U.S. Ser. No. 09/718,887 filed Nov. 21, 2000 by Gallagher et al. are appropriate. The remaining steps in this embodiment are identical to the corresponding steps described herein above.

Figure 13:
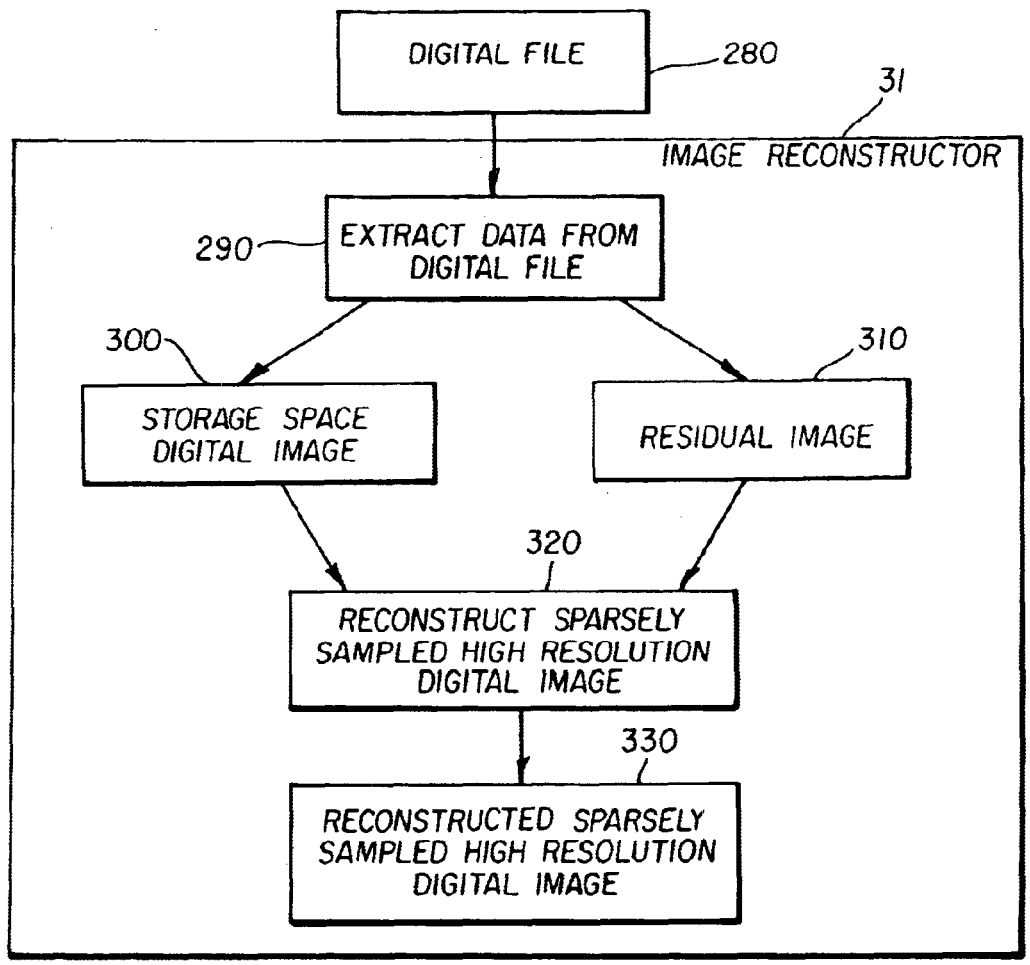
FIG. 13 illustrates a method for forming a reconstructed sparsely sampled high resolution digital image as performed by the image reconstructor 31.

The primary advantage of this embodiment is that the residual image 250 is computed relative to the sparsely sampled high resolution digital image 190. As shown in FIG. 13, representing the function of the image reconstructor 31 shown in FIG. 1, this allows for the creation of a reconstructed sparsely sampled high resolution digital image 330. The input to this process is a digital file 280 containing a storage space digital image 300 and a residual image 310 created as described above. The storage space digital image 300 and the residual image 310 are extracted 290 from digital file 280. A sparsely sampled high resolution digital image is reconstructed 320 to form a reconstructed sparsely sampled high resolution digital image 330 by combining the storage space digital image 300 and the residual image(s) 310. Typically, the reconstruction step 320 will involve combining the storage space digital image 300 and the residual image(s) 310.

The reconstructed sparsely sampled high resolution digital image 330 can be used for many different purposes. For example, a digital image processor 200 which implements the DREFA processor 22 and the CFA interpolator 26 utilizing a high level of complexity may be applied to the reconstructed sparsely sampled high resolution digital image 330 in order to create a full resolution digital image which has improved detail and dynamic range when compared to a full resolution digital image created with a digital image processor 200 having less complex processing.

The invention has been described in detail with particular reference to certain preferred embodiments thereof, but it will be understood that variations and modifications can be effected within the spirit and scope of the invention. For example, the invention provides an image capture system that expands the dynamic range in both directions, i.e., that expands the response of the fast photosites to increased exposures by utilizing the image signals from neighboring slow photosites and expands the response of the slow photosites to decreased exposures by utilizing the image signals from neighboring fast photosites. It would be likewise feasible for the system to work on dynamic range from only one direction, i.e., to expand the response of only the fast photosites to increased light exposures by utilizing the image signals from neighboring slow photosites, or alternatively, to expand the response of only the slow photosites to decreased light exposures by utilizing the image signals from neighboring fast photosites.

Parts List 2 lens
6 optical lowpass filter
10 image sensing device
14 A/D converter
22 DREFA processor
26 CFA interpolator
27 color encoder
28 slow photosite
29 digital image store
30 fast photosite
31 image reconstructor
32 red slow photosite
34 green slow photosite
36 blue slow photosite
38 red fast photosite
40 green fast photosite
42 blue fast photosite
44 slow pixel compensator
46 slow pixel thresholder
48 fast pixel thresholder
50 signal extender
51 lenslet
52 location
53*a–d* color filter array
54 light blocking mask portion
55 photosensitive area
56 large aperture
57 small aperture
58 neutral density filter layer
59 neutral density filter
120 extended color gamut digital image
121 adjust color values step
122 limited color gamut digital image
123 represent image in storage color space step
124 storage space digital image
125 compute residual image(s) step
126 residual image(s)
127 digital file storage step
128 digital file
130 extended color gamut digital image
131 adjust color values step
132 represent image in storage color space step
133 limited color gamut digital image
134 represent image in extended storage color space step
135 compute residual image step
136 residual image
137 digital file storage step
138 digital file
140 digital file
141 extract data from digital file step
142 limited color gamut digital image
143 residual image
144 reconstruct extended color gamut digital image step
145 reconstructed extended color gamut digital image
150 image modification(s)
151 modify limited color gamut digital image step
152 modify residual image step
153 modified limited color gamut digital image
154 modified residual image
155 modified digital file
190 sparsely sampled high resolution digital image
200 digital image processor
210 full resolution digital image
220 represent image in storage color space step
230 storage space digital image
240 compute residual image(s) step
250 residual image(s)
260 digital file storage step
270 digital file
280 digital file
290 extract data from digital file step
300 storage space digital image
310 residual image(s)
320 reconstruct sparsely sampled high resolution digital image step
330 reconstructed sparsely sampled high resolution digital image

What is claimed is:

1. An image capture system for generating and storing an extended dynamic range digital image, comprising:

a) a image sensing device having fast photosites with a predetermined response to light exposure interspersed with slow photosites with a slower response to the same light exposure for producing a sparsely sampled high resolution digital image having fast pixel values produced by the fast photosites and slow pixel values produced by the slow photosites;

b) a digital image processor that employs the slow pixel values to expand the dynamic range of the fast pixel values in the sparsely sampled high resolution digital image to form a full resolution digital image having an extended dynamic range;

c) an encoder for reducing the dynamic range of the full resolution digital image to fit within the dynamic range of a storage space having dynamic range less than the dynamic range of the full resolution digital image to form a limited dynamic range digital image represented in the storage space and for producing a residual image representing a difference between the full resolution digital image and the limited dynamic range digital image that can be used with the limited dynamic range digital image to reconstruct the full resolution digital image; and d) a digital image store for storing the limited dynamic range digital image in association with the residual image.

2. The image capture system claimed in claim 1, wherein the image sensing device is a color image sensor having an array of photosites and a color filter array arranged over the array of photosites; wherein the digital image processor includes a color filter array interpolator for interpolating color values at all of the photosites; and wherein the storage space is a storage color space.

3. The image capture system claimed in claim 1, wherein the digital image processor also employs the fast pixel values to expand the dynamic range of the slow pixel values in the sparsely sampled high resolution digital image.

4. The image capture system claimed in claim 1, wherein the image sensing device is located in a digital camera and the digital image processor is located in a host computer separate from the digital camera.

5. The image capture system claimed in claim 1, wherein the image sensing device and the digital image processor are included in a digital camera.

6. The image capture system claimed in claim 1, wherein the slow photosites have a response that is slower by at least one stop compared to the fast photosites.

7. The system claimed in claim 2, wherein the color filter array is a Bayer array.

8. The image capture system claimed in claim 1, further comprising an image reconstructor that employs the residual image and the limited dynamic range digital image to form a reconstructed full resolution digital image.

9. The image capture system claimed in claim 8, wherein the image reconstructor applies an image modification to the reconstructed fill resolution digital image.

10. The image capture system claimed in claim 1, wherein the limited dynamic range digital image is stored by the image store in a digital image file which includes the residual image as additional data in the digital image file.

11. The image capture system as claimed in claim 1, wherein the limited dynamic range digital image and the residual image are stored by the image store in separate associated digital image files.

12. A method for generating and storing an extended dynamic range digital image, comprising:

a) employing an image sensing device having fast photosites with a predetermined response to light exposure interspersed with slow photosites with a slower response to the same light exposure to produce a sparsely sampled high resolution digital image having fast pixel values produced by the fast photosites and slow pixel values produced by the slow photosites;

b) expanding the dynamic range of the fast pixel values in the sparsely sampled high resolution digital image to form a full resolution digital image having an extended dynamic range;

c) reducing the dynamic range of the full resolution digital image to fit within the dynamic range of a storage space having a dynamic range less than the dynamic range of the full resolution digital image to form a limited dynamic range digital image represented in the storage space and for producing a residual image representing a difference between the full resolution digital image and the limited dynamic range digital image that can be used with the limited dynamic range digital image to reconstruct the full resolution digital image; and d) storing the limited dynamic range digital image in association with the residual image.

13. The method as claimed in claim 12, further comprising the step of expanding the dynamic rang of the slow pixel values by utilizing neighboring fast pixel values.

14. The method as claimed in claim 13, wherein the step of expanding the respective response of the fast and slow pixel values, comprises the steps of:

a) comparing fast pixel values against a high exposure response threshold and replacing the fast pixel values exceeding the high exposure response threshold with pixel values that are a function of neighboring blow pixel values; and b) comparing slow pixel values against a low exposure response threshold and replacing the slow pixel values less than the low exposure response threshold with pixel values that are a function of neighboring fast pixel values.

15. The method claimed in claim 12, wherein a residual image representing a luminance difference and a residual image representing a chrominance difference are produced and stored.

16. The method claimed in claim 12, wherein the residual image is stored as tiles representing subset of pixels in separate tags in an image file.

17. An image capture system for generating and storing an extended dynamic range digital image, comprising:

a) a image sensing device having fast photosites with a predetermined response to light exposure interspersed with slow photosites with a slower response to the same light exposure for producing a sparsely sampled high resolution digital image having fast pixel values produced by the fast photosites and slow pixel values produced by the slow photosites;

b) a digital image processor that employs the slow pixel values to expand the dynamic range of the fast pixel values in the sparsely sampled high resolution digital image to form a full resolution digital image having extended dynamic range;

c) an encoder for reducing the dynamic range of the full resolution digital image to fit within the dynamic range of a storage space having a dynamic range less than the dynamic range of the full resolution digital image to form limited dynamic range digital image represented in the storage space and for producing a residual image representing a difference between the sparsely sampled high resolution digital image and the limited dynamic range digital image that can be used with the limited dynamic range digital image to reconstruct the sparsely sampled high resolution digital image; and d) a digital image store for storing the limited dynamic range digital image in association with the residual image.

* * * * *

UNITED STATES PATENT AND TRADEMARK OFFICE
CERTIFICATE OF CORRECTION

PATENT NO.         : 6,943,831 B2                       Page 1 of 1
APPLICATION NO. : 09/768695
DATED              : September 13, 2005
INVENTOR(S)        : Andrew C. Gallagher et al.

It is certified that error appears in the above-identified patent and that said Letters Patent is hereby corrected as shown below:

| | |
|---|---|
| Column 24, claim 13, line 16 | Replace the word "rang" with the word --range- |
| Column 24, claim 14, line 24 | Replace the work "blow" with the word --slow-- |
| Column 24, claim 17, line 50 | After 'image having" insert --an-- |
| Column 24, claim 17, line 56 | After "form" insert --a-- |

Signed and Sealed this

Fifteenth Day of August, 2006

JON W. DUDAS
*Director of the United States Patent and Trademark Office*